United States Patent
Kameko et al.

(10) Patent No.: US 10,163,553 B2
(45) Date of Patent: Dec. 25, 2018

(54) RESISTOR AND METHOD FOR PRODUCING THE SAME

(71) Applicant: KOA CORPORATION, Ina-shi, Nagano (JP)

(72) Inventors: Kenji Kameko, Nagano (JP); Kosuke Arai, Nagano (JP); Tadahiko Yoshioka, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 15/736,123

(22) PCT Filed: Jun. 8, 2016

(86) PCT No.: PCT/JP2016/067047
§ 371 (c)(1),
(2) Date: Dec. 13, 2017

(87) PCT Pub. No.: WO2016/204038
PCT Pub. Date: Dec. 22, 2016

(65) Prior Publication Data
US 2018/0174721 A1 Jun. 21, 2018

(30) Foreign Application Priority Data
Jun. 15, 2015 (JP) .................. 2015-120445

(51) Int. Cl.
*H01C 17/28* (2006.01)
*G01R 15/00* (2006.01)
(Continued)

(52) U.S. Cl.
CPC ............. *H01C 17/28* (2013.01); *G01R 15/00* (2013.01); *G01R 19/0092* (2013.01); *H01C 1/14* (2013.01); *H01C 13/00* (2013.01)

(58) Field of Classification Search
CPC ............ H01C 17/28; H01C 1/14; H01C 7/06; H01C 1/148
(Continued)

(56) References Cited

U.S. PATENT DOCUMENTS 2,708,701 A * 5/1955 Viola .................... G01R 1/203
324/126
RE39,660 E * 5/2007 Szwarc .................... H01C 7/06
219/216

(Continued)

FOREIGN PATENT DOCUMENTS

CN 101587766 A 11/2009
CN 102696079 A 9/2012
(Continued)

OTHER PUBLICATIONS

International Search Report in corresponding International Application No. PCT/JP2016/067047, dated Aug. 16, 2016, 5 pages.
Office Action/Search Report in Chinese Application No. 201680033540.7, dated Sep. 5, 2018, pp. 1-7.

*Primary Examiner* — Kyung Lee
(74) *Attorney, Agent, or Firm* — Brinks Gilson & Lione

(57) ABSTRACT

Provided is a resistor including a first electrode, a second electrode, and a resistive element disposed between the first and second electrodes. Each of the first and second electrodes includes a main electrode portion and a narrow electrode portion with a narrower width than that of the main electrode portion. The resistive element is disposed between the two narrow electrode portions.

5 Claims, 13 Drawing Sheets

(51) Int. Cl.
*H01C 13/00* (2006.01)
*G01R 19/00* (2006.01)
*H01C 1/14* (2006.01)

(58) Field of Classification Search
USPC .................................................. 338/49, 195
See application file for complete search history.

(56) References Cited

U.S. PATENT DOCUMENTS

| | | | | |
|---|---|---|---|---|
| 7,911,319 | B2 * | 3/2011 | Smith | H01C 1/148 |
| | | | | 29/610.1 |
| 8,031,043 | B2 * | 10/2011 | Schultz | H01C 1/014 |
| | | | | 338/254 |
| 8,198,977 | B2 * | 6/2012 | Smith | H01C 1/148 |
| | | | | 338/22 R |
| 8,248,202 | B2 * | 8/2012 | Brackhan | H01C 1/084 |
| | | | | 338/210 |
| 2011/0057764 | A1 | 3/2011 | Smith et al. | |
| 2013/0181807 | A1 * | 7/2013 | Hetzler | G01R 1/203 |
| | | | | 338/7 |
| 2013/0187749 | A1 * | 7/2013 | Tsukada | H01C 1/148 |
| | | | | 338/306 |

FOREIGN PATENT DOCUMENTS

| | | |
|---|---|---|
| JP | H06-224014 A | 8/1994 |
| JP | 2009-266977 A | 11/2009 |
| JP | 2014-170960 A | 9/2014 |

* cited by examiner

RESISTOR AND METHOD FOR PRODUCING THE SAME

This application is a 371 application of PCT/JP2016/067047 having an international filing date of Jun. 8, 2016, which claims priority to JP2015-120445 filed Jun. 15, 2015, the entire contents of which are incorporated herein by reference.

TECHNICAL FIELD

The present invention relates to a resistor and a method for producing the same.

BACKGROUND ART

In recent years, a shunt-based current sensing method that uses a metal plate resistor has been used to detect current of batteries of automobiles. Such a resistor is required to lower the actual resistance and suppress resistance loss. Patent Literature 1 proposes an electrode structure of a metal plate resistor for avoiding deformation due to bolting, in which bolt holes are provided in electrodes, which are joined to opposite ends of a resistive element, for fastening the electrodes to bus bars and the like.

CITATION LIST

Patent Literature

Patent Literature 1: JP 2009-266977 A

SUMMARY OF INVENTION

Technical Problem

FIG. 13 shows a view in which a shunt resistor 101 is fastened to bus bars 107.

The shunt resistor 101 preferably has a structure in which end faces 113a, 113b of a resistive element 103 and copper electrodes 105a, 105b are butt-joined and welded together, respectively. However, there is a problem in that the workpiece may become distorted during welding or machining of the electrodes, which can adversely affect the joined state.

In order to dispose such a shunt resistor 101 on an apparatus to be measured, there is known a method of fastening the electrodes 105a, 105b of the shunt resistor 101 to bus bars 107 through which current to be measured flows, through screwing (111). When such screwing is performed, stress in the direction of rotation (L101) is generated on the shunt resistor 101 due to the screwing. Herein, if a load is applied to the joined portions (e.g., welded portions) 113a, 113b of the resistive element 103 and the electrodes 105a, 105b of the shunt resistor 101 due to the stress, the joined state would be adversely affected and the resistance value would change, for example, which can interrupt high-accuracy current sensing.

It is an object of the present invention to relax stress that is generated in a welded portion during a process for producing a resistor.

Solution to Problem

According to an aspect of the present invention, there is provided a resistor including a first electrode, a second electrode, and a resistive element disposed between the first and second electrodes. Each of the first and second electrodes includes a main electrode portion and a narrow electrode portion with a narrower width than that of the main electrode portion. The resistive element is disposed between the two narrow electrode portions. The width of the resistive element is preferably narrower than that of each main electrode portion.

Since the resistive element is disposed between the two narrow electrode portions, stress in the direction of rotation can be easily relaxed.

The width of each narrow electrode portion is preferably set substantially equal to that of the resistive element. Accordingly, the production steps as well as the structure becomes simple.

A voltage sensing terminal may be disposed on each narrow electrode portion.

According to another aspect of the present invention, there is provided a method for producing a resistor, including preparing an electrode material and a resistive material; welding the electrode material and the resistive material together to form a joined base material including the electrode material, the resistive material, and a joined portion thereof; and partially cutting off the joined base material to form main electrode portions and narrow portions with narrower widths than those of the main electrode portions. Each narrow portion is formed such that it includes the joined portion of the resistive material and the electrode material.

Accordingly, as the resistive element is disposed in the narrow portions, stress in the direction of rotation can be easily relaxed.

Each narrow portion preferably includes the electrode material, and the method preferably further includes fixing a voltage sensing terminal on each narrow portion of the electrode material.

In the cutting, the width of the resistive element and that of the electrode material are preferably made approximately equal so that the narrow portions are formed. Accordingly, the production steps as well as the structure becomes simple.

The present specification incorporates the disclosure of JP Patent Application No. 2015-120445 that forms the basis of the priority claim of the present application.

Advantageous Effects of Invention

According to the present invention, stress that is applied to a welded portion of a resistor can be relaxed.

DETAILED DESCRIPTION OF THE PREFERRED EMBODIMENTS

In this specification, "welding" refers to a joining method that includes applying heat, pressure, or both to joined portions of two or more members and also adding proper filler metal thereto as appropriate so as to form a single member of the integrated, continuous joined portions.

Hereinafter, a resistor and a production method therefor in accordance with an embodiment of the present invention will be described in detail with reference to examples of a resistor with a butt-joint structure in which end faces of a resistive element and end faces of electrodes are butt-joined together, respectively, and a production method therefor. It should be noted that such a technique can also be applied to a structure in which a resistive element and electrodes are connected together at their surfaces.

In this specification, a direction in which an electrode, a resistive element, and another electrode of a resistor are arranged is referred to as a length direction, and a direction that intersects the length direction is referred to as a width direction.

(First Embodiment)

Figure 1:
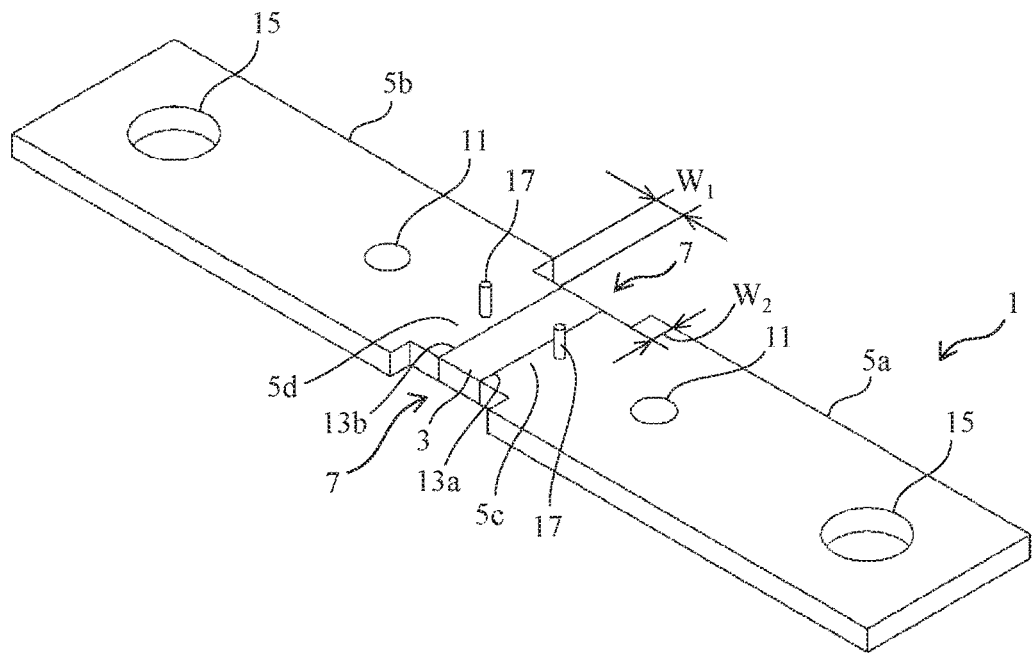
FIG. 1 is a perspective view showing an exemplary configuration of a resistor in accordance with a first embodiment of the present invention.

First, a resistor in accordance with a first embodiment of the present invention will be described. FIG. 1 is a perspective view showing an exemplary configuration of a resistor in accordance with this embodiment. A shunt resistor (hereinafter referred to as a "resistor") 1 shown in FIG. 1 includes two electrode portions 5a (first electrode), 5b (second electrode), and a resistive element 3 disposed between the electrode portions 5a, 5b. The electrode portions 5a, 5b include end-side main electrode portions (herein, portions excluding 5c, 5d of the electrode portions 5a, 5b are defined as main electrode portions) and narrow electrode portions 5c, 5d that are located on the side of the resistive element 3 and have widths narrower than those of the main electrode portions by $2W_2$, respectively. The resistive element 3 is disposed between the narrow electrode portions 5c, 5d. It is assumed that the dimension of each of the narrow electrode portions 5c, 5d in the length direction is $W_1$. The dimension $W_1$ herein is about 1 to 3 mm, for example.

The structure shown in FIG. 1 can be formed by providing recess portions (narrow portions) 7 that are recessed inward in the width direction of a part of a region including the joined portions 13a, 13b that have been formed by welding the resistive element 3 and the electrode portions 5a, 5b together, for example. In such a case, the width of each of the narrow electrode portions 5c, 5d is substantially equal to that of the resistive element 3. Portions that are formed by the recess portions 7 and thus are narrow are referred to as narrow portions (hereinafter the same).

According to the resistor in this embodiment, since the recess portions 7 are formed in a part of a region including the joined portions 13a, 13b of the resistive element 3 and the electrode portions 5a, 5b, it is possible to suppress concentration of stress generated across the resistor 1 on the joined portions 13a, 13b of the resistor 1.

Even when the recess portions 7 are formed to a length of about 1 to 3 mm ($W_1$) from the boundaries between the resistive element 3 and the electrode portions 5a, 5b, a stress relaxation effect of greater than or equal to 10% is obtained. Further, providing the recess portions 7 can stabilize current distribution in a current path, and thus can improve the TCR characteristics.

Figure 13:
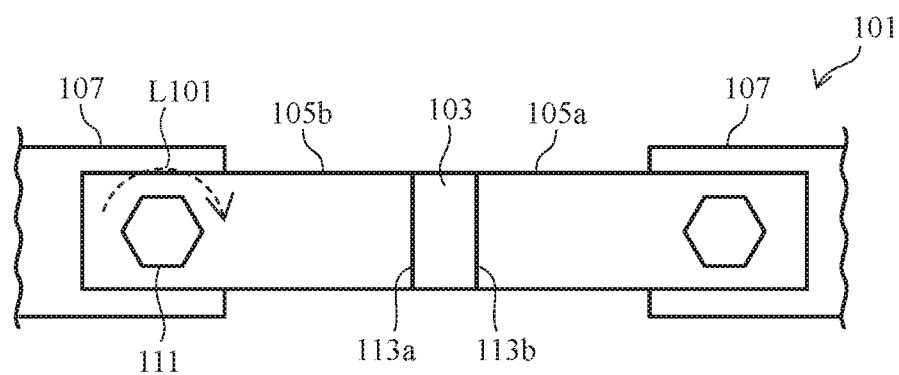
FIG. 13 is a typical view in which a shunt resistor is fastened to bus bars.

It should be noted that in FIG. 1, reference numeral 15 denotes bolt holes similar to those in FIG. 13. Reference numeral 11 denotes holes for fixing a current sensing substrate (which will be omitted hereinafter). In addition, reference numeral 17 denotes voltage sensing terminals that are provided on the narrow electrode portions 5c, 5d, respectively, in this example. Since the voltage sensing terminals 17 are provided on the narrow electrode portions 5c, 5d, respectively, and the voltage sensing terminals 17 are thus formed at positions close to the resistive element 3, current measurement accuracy in four-terminal measurement can be improved.

Figure 2:
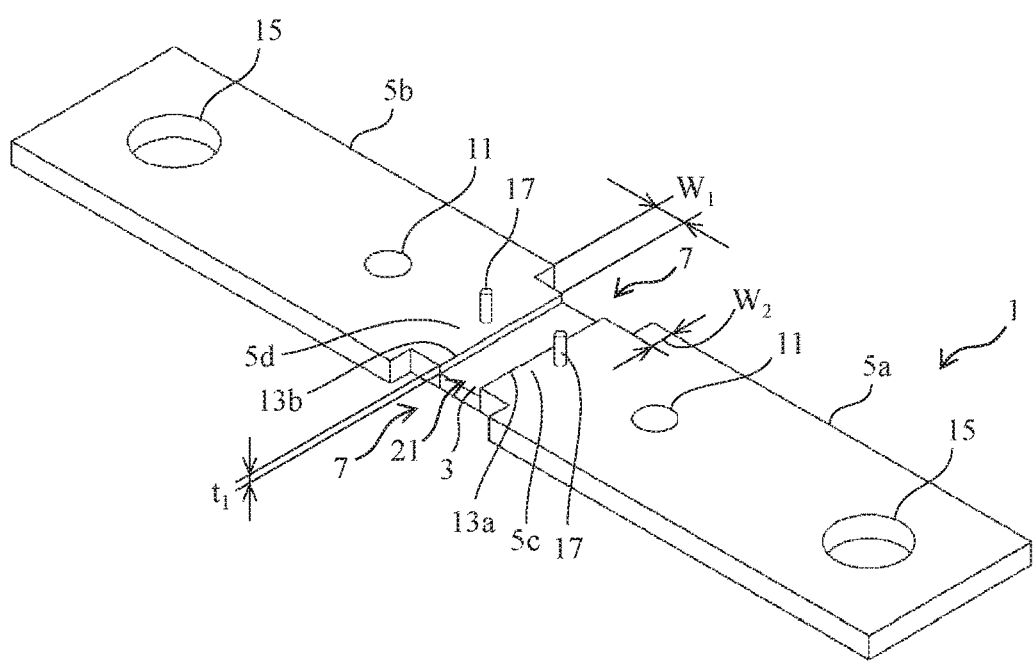
FIG. 2 is a perspective view showing a modified example of FIG. 1.

FIG. 2 is a perspective view of a resistor in accordance with a modified example of FIG. 1. In the structure of FIG. 2, the resistive element 3 is formed thinner than the narrow electrode portions 5c, 5d by $t_1$ as compared to that in the structure in FIG. 1. Therefore, there is an advantage in that the joined portions of the electrodes and the resistive element have smaller areas than those of the structure shown in FIG. 1, and the stress relaxation effect is thus increased.

(Second Embodiment)

Next, a method for producing a resistor in accordance with a second embodiment of the present invention will be described. As an example of a resistor to be produced, the structure shown in FIG. 1 is used.

FIGS. 3(a) through 3(c), 4A(d) through 4A(f), and 4B(g) and 4B(h) are views each showing a method for producing the resistor in accordance with this embodiment, and showing a plan view and a cross-sectional view in pairs.

Figure 3A:
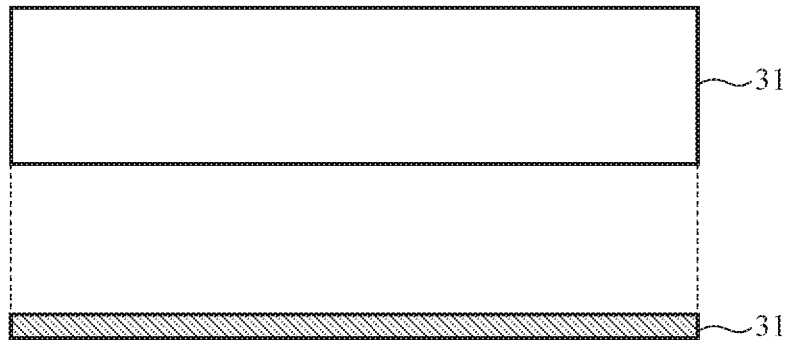
FIGS. 3(a) through 3(c) are views showing an exemplary method for producing a resistor in accordance with a second embodiment of the present invention.

As shown in FIG. 3(a), first, an electrode material 31 with high electrical conductivity, such as Cu, is prepared.

Figure 3B:
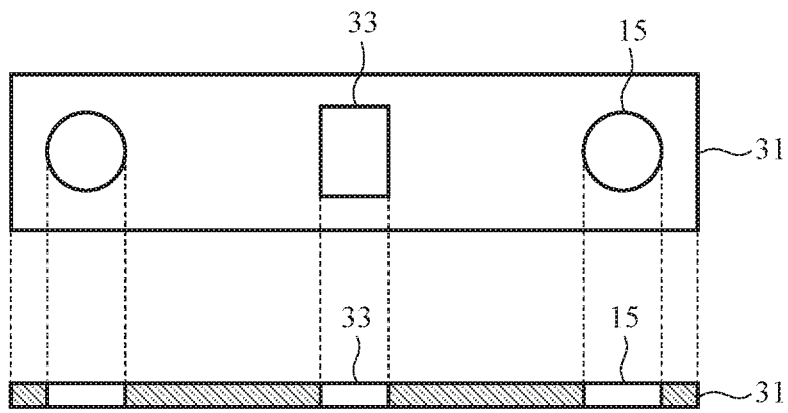

As shown in FIG. 3(b), the bolt holes 15 for screwing and a hole portion 33 adapted to have a resistive material embedded therein are formed in the electrode material 31 using a method such as pressing, cutting, or laser machining. Specifically, a single hole portion 33 is provided at a substantially central position of the electrode material 31, and a pair of bolt holes 15 are provided at positions close to the ends of the electrode material 31 in the length direction.

Figure 3C:
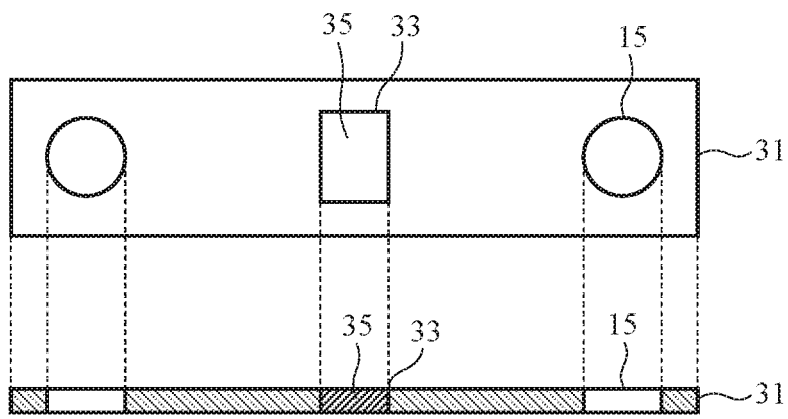

As shown in FIG. 3(c), a resistive material 35 prepared in advance, which has substantially the same size as the hole portion 33 and has higher resistance than the electrode material 31, is embedded in the hole portion 33. Therefore, the outer side face of the resistive material 35 abuts the inner side face of the hole portion 33 so that joined portions in a rectangular shape are formed, for example.

For both the electrode material 31 and the resistive material 35, long materials (plates) that have been cut out can be used, for example.

As the resistive material 35, a metal plate material such as a Cu—Ni, Cu—Mn, or Ni—Cr-based material can be used. As the electrode material 31, Cu or the like can be used.

Figure 4A:
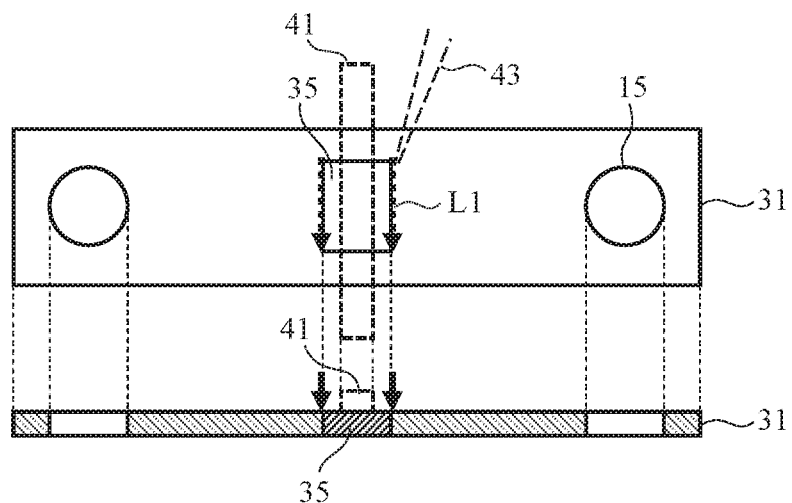
FIGS. 4A(d) through 4A(f) are views continued from FIGS. 3(a) through 3(c).
Figure 4A:
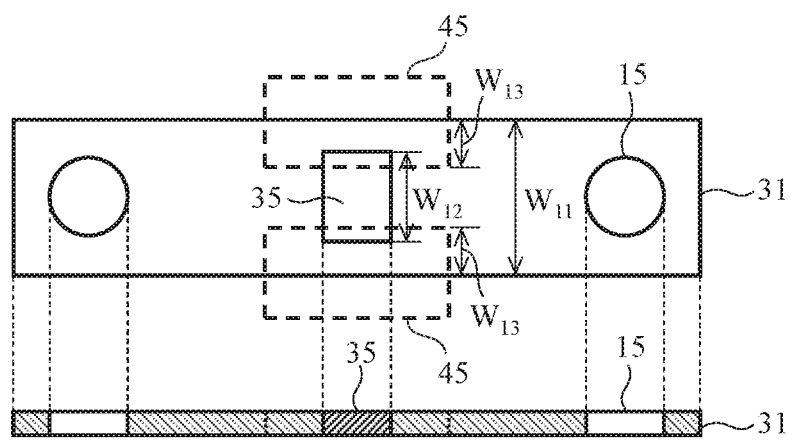
Figure 4A:
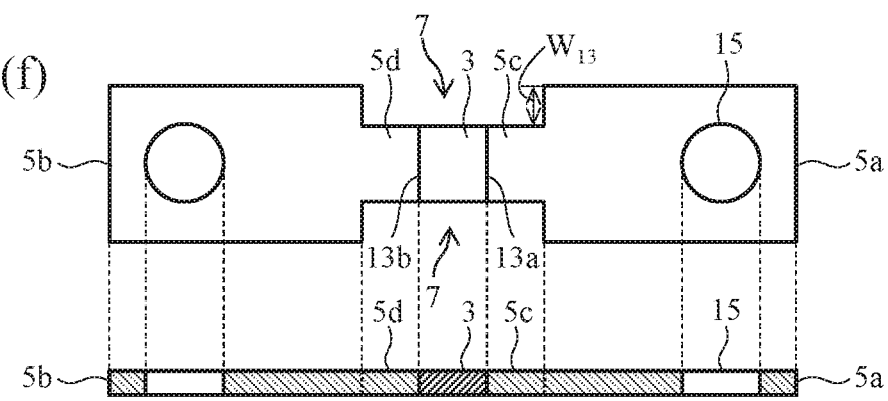

As shown in FIG. 4A(d), the resistive material 35 is fixed in the electrode material 31 using a pressing jig 41 or the like, and is scanned with an electron beam or a laser beam 43, for example, as indicated by reference numeral L1 so that the joined portions of the electrode material 31 and the resistive material 35 are welded together and a joined base material can thus be formed that has the electrode material 31 and the resistive material 35 embedded in and joined to the central region of the electrode material 31.

Since the through-hole (hole portion 33) is provided in the electrode material 31, and the resistive material 35 is embedded in the through-hole, distortion of the electrode material 31 (workpiece) can be suppressed even when welding is performed with an electron beam or the like. Further, when the pressing jig 41 is used, distortion of the workpiece can be suppressed more, which is advantageous.

As shown in FIG. 4A(e), in order to determine the resistance value, press working (45) for determining the width of the resistive element 35 is performed, for example. Herein, regions including the ends of the resistive element 35 in the width direction are cut off to form the recess portions 7 (FIG. 4A(f)). Then, as the resistive element 35 embedded is cut off by a width of $W_{13}$ from side faces thereof with respect to the initial width $W_{12}$, the width of the resistive element becomes smaller by $\{(W_{12}+2W_{13})-W_{11}\}$ and the resistance value can thus be adjusted. Further, if the start point and the end point of welding are cut off, variations in joining of the joined portions 13a, 13b can also be suppressed and stress can thus be relaxed. Herein, although the widths of the two cut-off portions are equal as indicated by the width $W_{13}$, the widths of the two cut-off portions may be different.

Figure 4B:
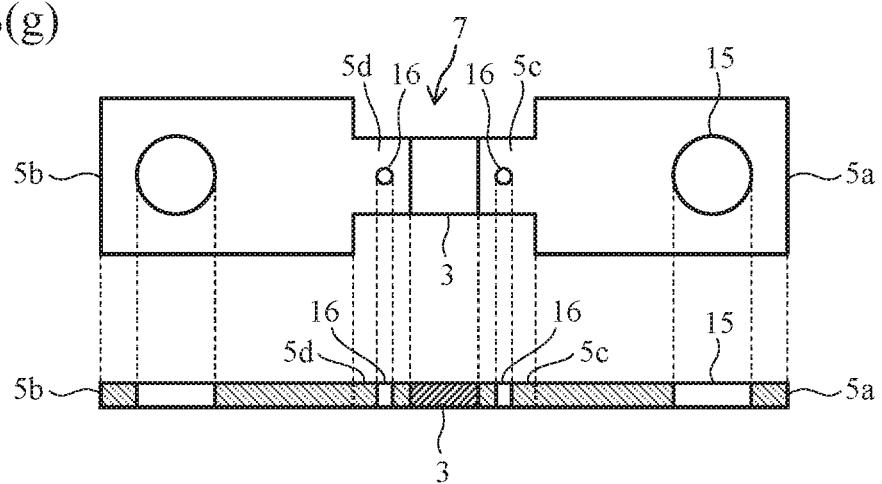
FIGS. 4B(g) and 4B(h) are views continued from FIGS. 4A(d) and 4A(f).
Figure 4B:
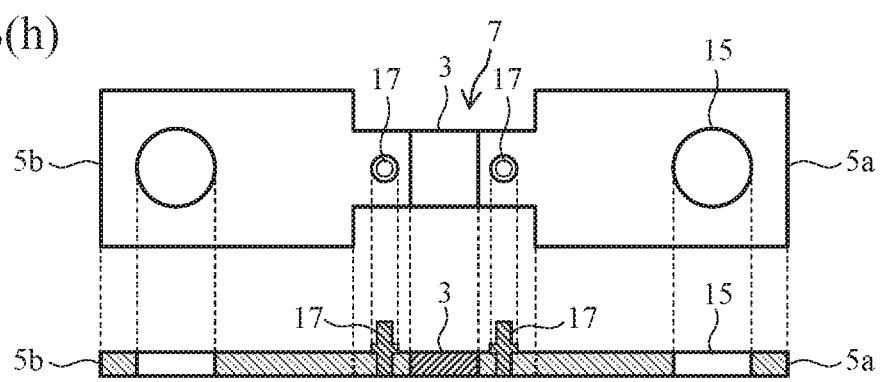

As shown in FIG. 4B(g), through-holes 16 are formed in the narrow electrode portions 5c, 5d, respectively.

As shown in FIG. 4B(h), voltage sensing terminals 17 that penetrate the respective through-holes 16 are formed. The voltage sensing terminals 17 are formed by disposing bar-like terminals in an upright position on the narrow electrode portions 5c, 5d, respectively, for example. The voltage sensing terminals 17 provided in such a manner can be used as a current sensing device.

It should be noted that when the voltage sensing terminals 17 are not formed, it is preferable to, in the state of FIG. 4A(f), measure voltage using a method of joining bonding wires at positions where the through-holes 16 are to be provided in FIG. 4B(g), for example.

Through the aforementioned production steps, the resistor shown in FIG. 1 can be produced.

It should be noted that when electron beam welding or the like is performed as shown in FIG. 4A(d), there is a possibility that the joined state at the start point and the end point of the joined portion may become unstable and such portion can become the origin of breakage. Herein, if cutting is performed at a portion including the start point and the end point as shown in FIG. 4A(e), it is possible to maintain the excellent joined state in addition to obtaining the aforementioned stress relaxation effect.

Figure 5:
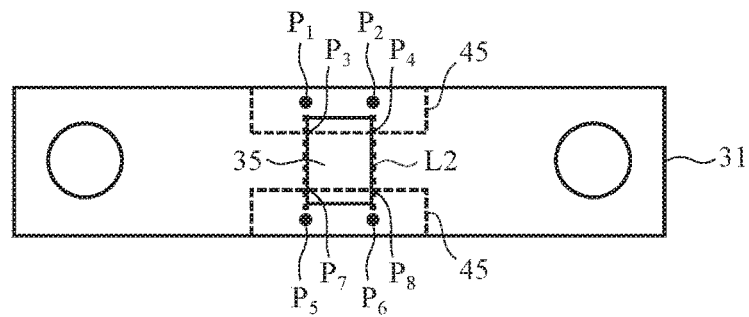
FIG. 5 is a view showing a modified example of a method for producing a resistor in accordance with a second embodiment of the present invention.

In addition, as shown in FIG. 5, when electron beam welding or the like is performed, the start point and the end point of the portion to be welded may be set at not positions $P_3$-$P_4$ to $P_7$-$P_8$, which are the boundaries between the resistive material 35 and the electrode material 31 but positions beyond such positions, for example, positions $P_1$-$P_5$ (L2) and $P_2$-$P_6$ (L2) including the inner side of the resistive material 35.

(Third Embodiment)

Next, a method for producing a resistor in accordance with a third embodiment of the present invention will be described. As an example of the resistor to be produced, the structure shown in FIG. 1 is used.

Figure 6A:
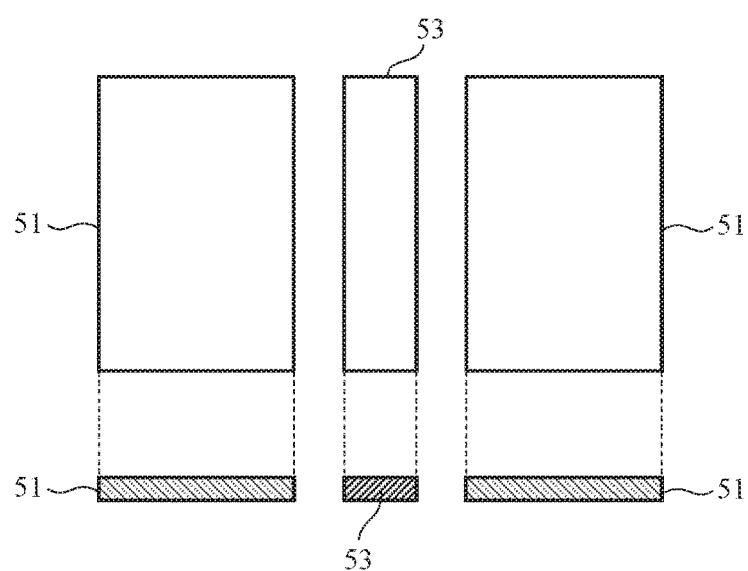
FIGS. 6(a) and 6(b) are views showing an exemplary method for producing a resistor in accordance with a third embodiment of the present invention.
Figure 6B:
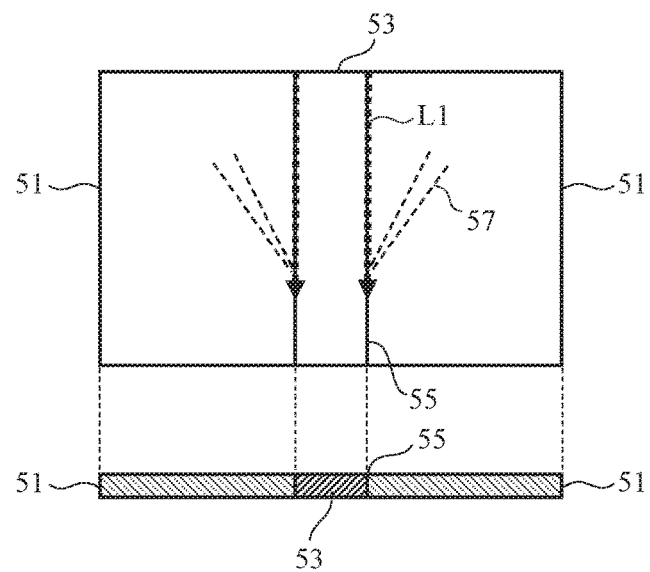
Figure 7A:
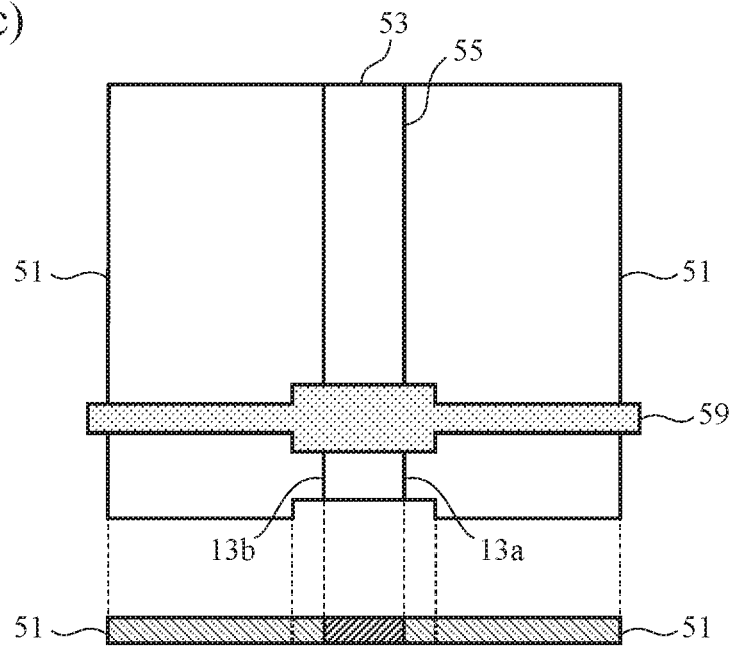
FIGS. 7A(c) and 7(d) are views continued from FIGS. 6(a) and 6(b).
Figure 7A:
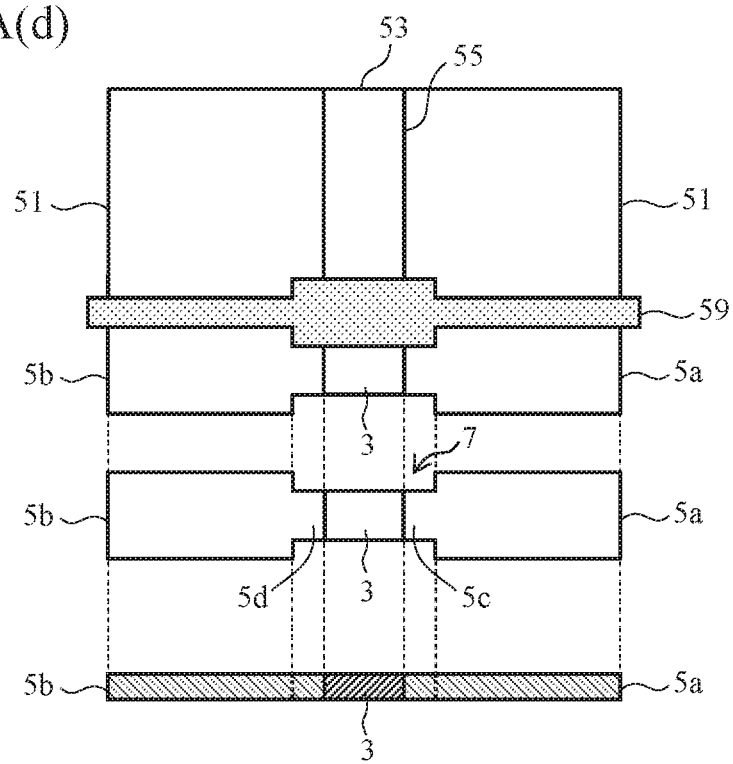

FIGS. 6(a) and 6(b), 7A(c) and 7A(d), and 7B(e) and 7B(f) are views showing a method for producing the resistor in accordance with this embodiment, and showing a plan view and a cross-sectional view in pairs.

As shown in FIG. 6(a), for example, a resistive material 53 in a long flat-plate shape or the like, and first and second electrode materials 51, each of which is made of an electrode material with higher electrical conductivity than that of the resistive material 53 and is in a long flat-plate shape like the resistive material 53, are prepared.

As shown in FIG. 6(b), opposite end faces of the resistive material 53 and end faces of the first and second electrode materials 51 are arranged such that they contact each other and from joined portions. Then, the joined portions 55 are welded together with an electron beam or a laser beam 57, for example, as indicated by reference numeral L1 so that a single flat plate is formed. Various adjustments such as adjustments of the resistance value and shape can also be performed through adjustment of the joined positions.

As shown in FIGS. 7A(c) and 7A(d), the resistor material (joined base material) including the joined portions 55 is cut using a die 59 that extends in the length direction and is wider in a region including the resistive material 53 and the electrode materials 51 around the resistive material 53. Since a resistor with recess portions 7 similar to those in the first and second embodiments can be formed, mass productivity improves.

Figure 7B:
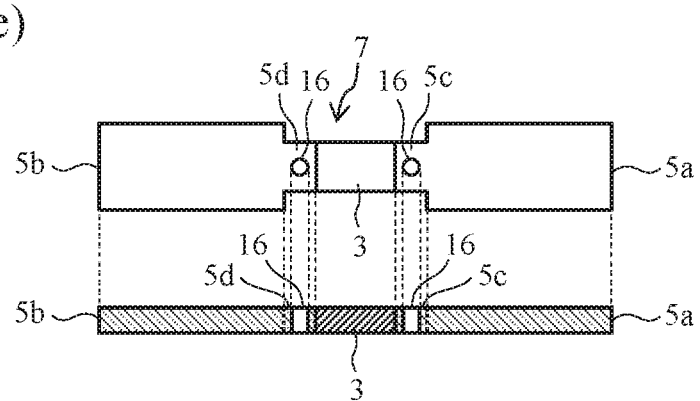
FIGS. 7B(e) and 7B(f) are views continued from FIGS. 7A(c) and 7A(d).
Figure 7B:
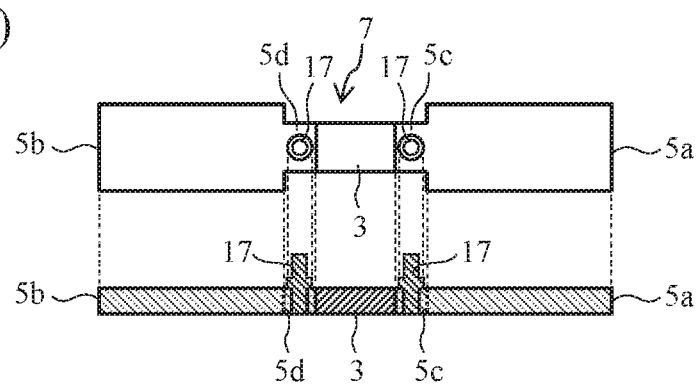

Next, as shown in FIG. 7B(e), through-holes 16 are formed in the narrow electrode portions 5c, 5d, respectively.

As shown in FIG. 7B(f), voltage sensing terminals 17 that penetrate the respective through-holes 16 are formed. The voltage sensing terminals 17 are formed by disposing bar-like terminals in an upright position on the narrow electrode portions 5c, 5d, respectively, for example. The voltage sensing terminals 17 provided in such a manner can be used as a current sensing device.

Through the aforementioned steps, a number of resistors such as the one shown in FIG. 1 that includes main electrode portions and narrow electrode portions can be produced.

(Fourth Embodiment)

Next, a method for producing a resistor in accordance with a fourth embodiment of the present invention will be described. As an example of a resistor to be produced, the structure shown in FIG. 1 is used, for example.

Figure 8A:
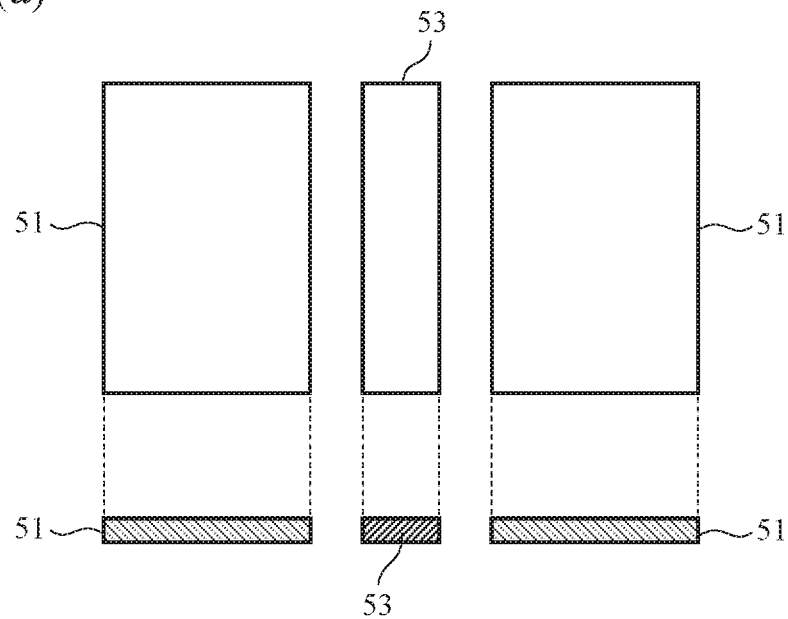
FIGS. 8(a) and 8(b) are views showing an exemplary method for producing a resistor in accordance with a fourth embodiment of the present invention.
Figure 8B:
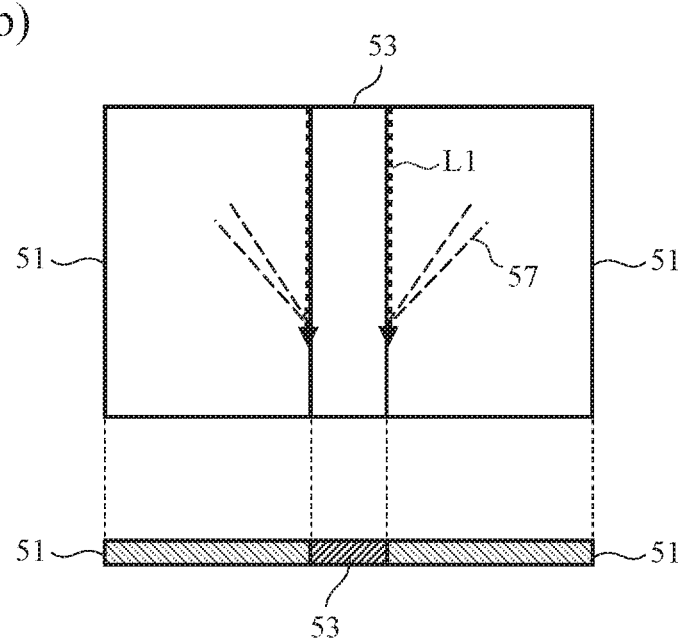
Figure 9A:
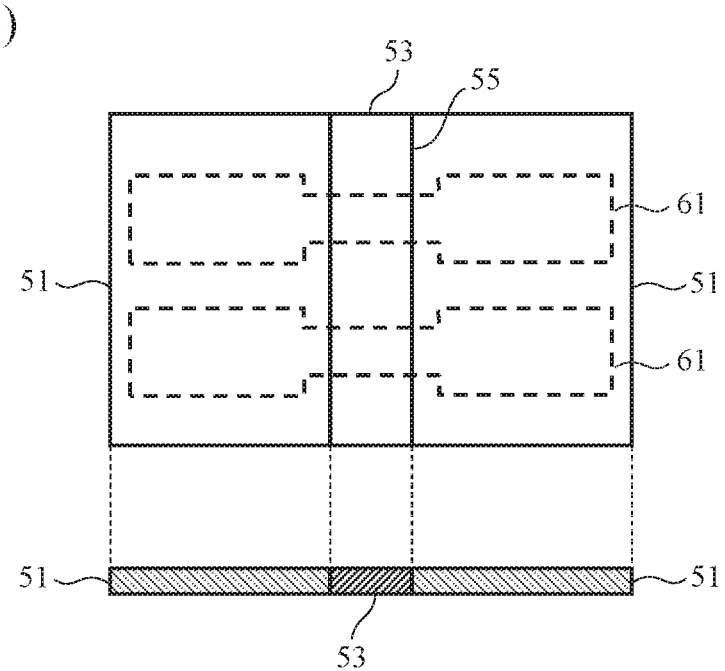
FIGS. 9A(c) and 9A(d) are views continued from FIGS. 8(a) and 8(b).
Figure 9A:
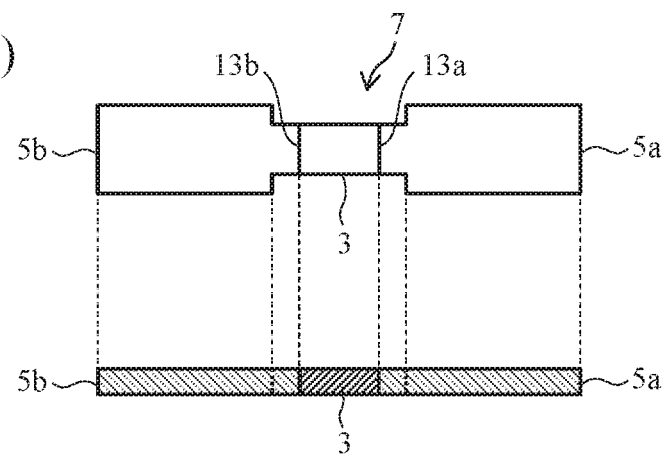

FIGS. 8(a) and 8(b), 9A(c) and 9A(d), and 9B and 9B(f) are views showing a method for producing the resistor in accordance with this embodiment, and showing a plan view and a cross-sectional view in pairs.

The steps of forming a resistive material (joined base material) shown in FIGS. 8(a) and 8(b) are similar to those shown in FIGS. 6(a) and 6(b).

As shown in FIG. 9A(c), the joined base material is stamped using a die 61 with a shape as indicated by the dashed line, that is, a shape that conforms to the shape of a resistor having recess portions in the length direction. In such a case, a number of resistors may also be stamped out in a single step.

As shown in FIG. 9A(d), a resistor with recess portions 7 can be formed in a region including the joined portions 13a, 13b. Therefore, advantageous effects similar to those in each of the first to third embodiments can be obtained.

Figure 9B:
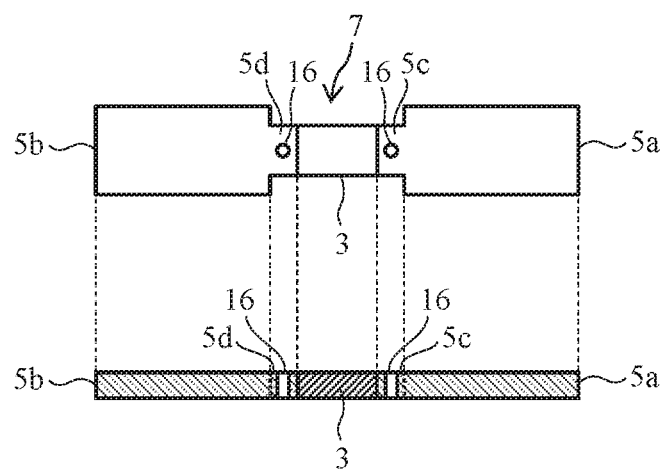
FIGS. 9B(e) and 9B(f) are views continued from FIGS. 9A(c) and 9A(d).
Figure 9B:
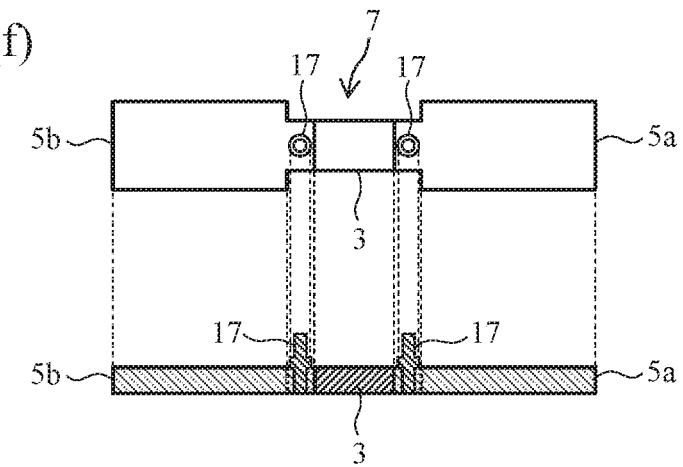

As shown in FIG. 9B(e), through-holes 16 are formed in the narrow electrode portions 5c, 5d, respectively.

As shown in FIG. 9B(f), voltage sensing terminals 17 that penetrate the respective through-holes 16 are formed. The voltage sensing terminals 17 are formed by disposing bar-like terminals in an upright position on the narrow electrode portions 5c, 5d, respectively, for example. The voltage sensing terminals 17 provided in such a manner can be used as a current sensing device.

Through the aforementioned steps, a number of resistors such as the one shown in FIG. 1 that includes main electrode portions and narrow electrode portions can be produced.
(Fifth Embodiment)

Figure 10A:
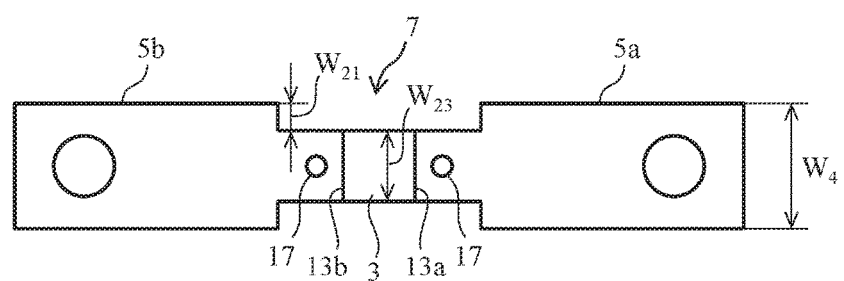
FIGS. 10(a) and 10(b) are views showing a fifth embodiment of the present invention.
Figure 10B:
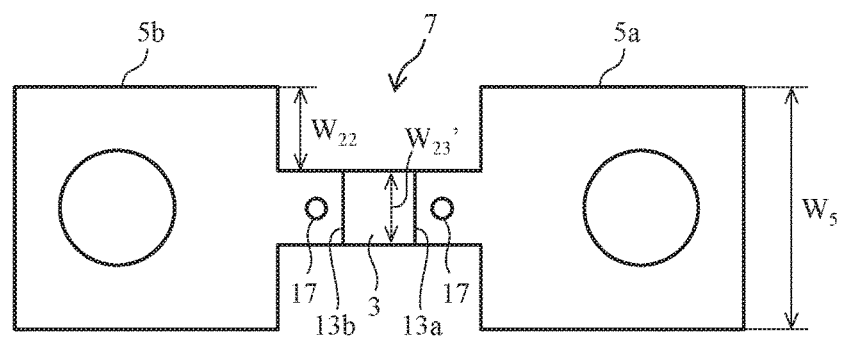

FIGS. 10(a) and 10(b) are views each showing a resistor in accordance with a fifth embodiment of the present invention. These are examples in which the sizes of the main electrodes are changed and the diameters of the threaded holes are changed correspondingly.

That is, with respect to the shape shown in FIG. 1, the depths (widths) of the recess portions 7 including the joined portions 13a, 13b are adjusted to $W_{21}$ or $W_{22}$ with the width $W_{23}$ of the resistive element kept constant, whereby it becomes possible to easily change the design, specifically, change only the sizes of the main electrodes with the resistance value kept constant.

In particular, when the production method described in the second embodiment is used, the steps can be performed without wasting the resistive material 35.
(Modified Example)

Hereinafter, a resistor in accordance with a modified example of the present invention will be described. The following modified example is a modified example concerning the shapes of the recess portions 7. Voltage sensing terminals may be either provided or not.

Figure 11A:
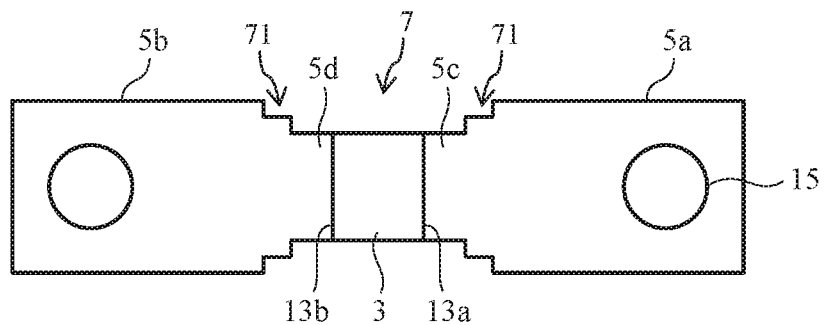
FIGS. 11(a) and 11(b) are views showing modified examples of the fifth embodiment of the present invention.

FIG. 11(a) shows a modified example of the resistor shown in FIG. 1 in which the recess portions 7 including the joined potions 13a, 13b each have a zig-zag shape in the width direction, and the narrow electrode portions 5c, 5d each have a plurality of widths. According to such shapes of the narrow electrode portions 5c, 5d whose widths are gradually reduced toward the resistive element 3, the stress relaxation effect at the welded portions (joined portions 13a, 13b) can be increased even more.

Figure 11B:
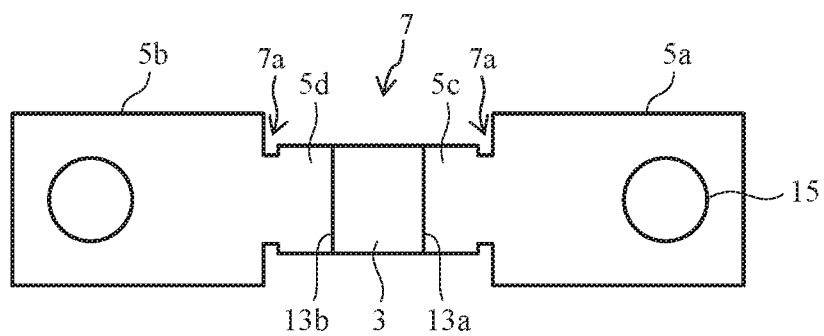

FIG. 11(b) shows a modified example in which a part of the recess portions 7 including the joined portions 13a, 13b of the narrow electrode portions 5c, 5d is formed even narrower. According to such a shape, with regions in which a part of the recess portions 7 including the joined portions 13a, 13b is made even narrower, the stress relaxation effect at the joined portions 13a, 13b (welded portions) can be increased even more.

Figure 12A:
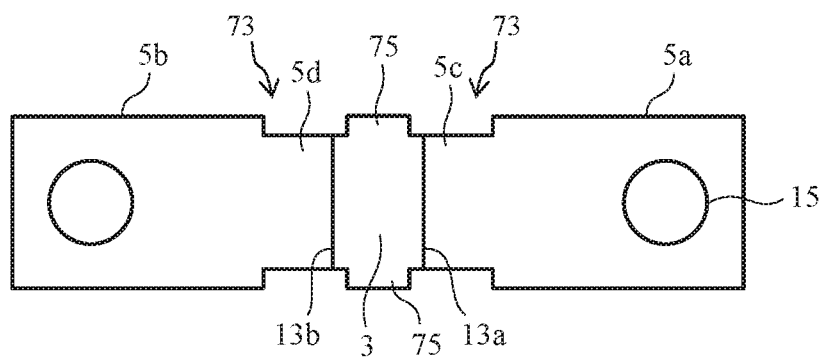
FIGS. 12(a) and 12(b) are views showing modified examples of the fifth embodiment of the present invention.

FIG. 12(a) shows an example in which a part of regions including the joined portions 13a, 13b (welded portions) is stamped and the other part of the regions is not stamped so as to secure the width of the resistive element. According to such a shape, the resistance value can be kept unchanged with the stress relaxation effect maintained. In addition, there is an advantage in that the resistive material is not wasted.

Figure 12B:
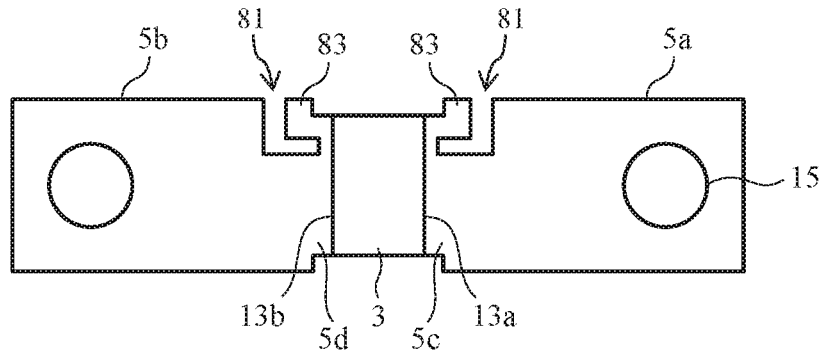

FIG. 12(b) is a view showing an example in which the joined portions 13a, 13b (welded portions) are partially stamped and voltage extraction portions 83 are formed in the narrow electrode portions 5c, 5d. According to such a shape, the voltage extraction portions 83 can be formed with the stress relaxation effect maintained.

In the aforementioned embodiments, the configurations and the like shown in the attached drawings are not limited thereto and can be changed as appropriate within the range that the advantageous effects of the present invention are exerted. Further, the configurations and the like can be changed as appropriate within the scope of the object of the present invention.

The configurations of the present invention can be freely selected, and an invention that includes the selected configurations is also included in the present invention.

INDUSTRIAL APPLICABILITY

The present invention is applicable as a method for producing a resistor.

All publications, patents, and patent applications that are cited in this specification are all incorporated by reference into this specification.

What is claimed is:

1. A resistor having a length in a length direction, a width in a width direction perpendicular to the length diction, and a thickness in a thickness direction perpendicular to both the length diction and the width direction, the resistor comprising:
   a first electrode, a second electrode, and a resistive element disposed between the first and second electrodes, the first and second electrodes and the resistive element being in alignment in the length direction, wherein each of the first and second electrodes includes a main electrode portion and a narrow electrode portion arranged in the length diction, so that each of the first and second electrodes has a first lengthwise end in the narrow electrode portion and a second lengthwise end in the main electrode portion, the narrow electrode portion being of a width narrower than that of the main electrode portion, and the resistive element having lengthwise ends in the length diction, the lengthwise ends of the resistive element being in contact, respectively, with the first lengthwise ends of the narrow electrode portions; and,
   a pair of voltage terminals standing in the thickness direction, respectively, in the first and second electrodes so that each of the voltage terminals is situated at least partially in the narrow electrode portion.

2. The resistor according to claim 1, wherein the resistive element is of a width along its length narrower than that of each of the main electrode portions of the first and second electrodes.

3. The resistor according to claim 1, wherein the first and second lengthwise ends of the narrow electrode portions are of a width substantially equal to that of the resistive element.

4. A method for producing a resistor having a length in a length direction, a width in a width direction perpendicular to the length diction, and a thickness in a thickness direction perpendicular to both the length diction and the width direction, the method comprising:
   preparing an electrode material and a resistive material;
   welding the electrode material and the resistive material together to form a joined base material;
   cutting the joined base material to form the register so that the resister comprises a first electrode, a second electrode, and a resistive element disposed between the first and second electrodes, the first and second electrodes and the resistive element being in alignment in the length direction, wherein each of the first and second electrodes includes a main electrode portion and a narrow electrode portion arranged in the length diction, so that each of the first and second electrodes has a first lengthwise end in the narrow electrode portion and a second lengthwise end in the main electrode portion, the narrow electrode portion being of a width narrower than that of the main electrode portion, and the resistive element having lengthwise ends in the length diction, the lengthwise ends of the resistive element being in contact, respectively, with the first lengthwise ends of the narrow electrode portions; and forming a pair of voltage terminals so as to stand in the thickness direction, respectively, in the first and second electrodes so that each of the voltage terminals is situated at least partially in the narrow electrode portion.

5. The method for producing a resistor according to claim 4, wherein cutting the joined base material comprises forming the first and second lengthwise ends of the narrow electrode portions to have a width substantially equal to that of the resistive element.

* * * * *